(12) United States Patent
Kerselaers et al.

(10) Patent No.: US 11,038,605 B1
(45) Date of Patent: Jun. 15, 2021

(54) VEHICLE RADIO INTERFERENCE SENSOR

(71) Applicant: NXP B.V., Eindhoven (NL)

(72) Inventors: Anthony Kerselaers, Herselt (BE); Liesbeth Gommé, Anderlecht (BE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/775,203

(22) Filed: Jan. 28, 2020

(51) Int. Cl.
*H04B 17/345* (2015.01)
*H04B 1/10* (2006.01)

(52) U.S. Cl.
CPC ......... *H04B 17/345* (2015.01); *H04B 1/1009* (2013.01); *H04B 1/1027* (2013.01)

(58) Field of Classification Search
CPC ... H04B 17/345; H04B 1/1009; H04B 1/1027
See application file for complete search history.

(56) References Cited

U.S. PATENT DOCUMENTS

| | | | | |
|---|---|---|---|---|
| 3,816,669 A | * | 6/1974 | Meh | H04M 1/654 379/373.01 |
| 4,329,665 A | * | 5/1982 | Kawai | H01R 13/7197 333/182 |
| 4,731,578 A | * | 3/1988 | Tsaprazis | F16N 29/00 324/204 |
| 4,794,353 A | * | 12/1988 | Broyde | H03H 7/06 333/12 |
| 5,103,197 A | * | 4/1992 | Turunen | H01P 1/2056 333/134 |
| 5,530,349 A | * | 6/1996 | Lopez | G01R 33/04 324/254 |
| 5,600,248 A | * | 2/1997 | Westrom | G01R 31/088 324/522 |
| 5,684,466 A | * | 11/1997 | Keating | G01R 19/145 340/661 |
| 5,821,832 A | * | 10/1998 | Moreau | H04B 3/00 333/177 |
| 6,421,532 B1 | | 7/2002 | Lindenmeier et al. | |
| 10,381,995 B1 | | 8/2019 | Kerselaers et al. | |
| 2001/0019264 A1 | | 9/2001 | Shattil | |
| 2002/0039028 A1 | * | 4/2002 | Douglas | H04B 3/46 324/658 |
| 2004/0178806 A1 | * | 9/2004 | Foreman | G01N 17/043 324/691 |

(Continued)

FOREIGN PATENT DOCUMENTS

| | | |
|---|---|---|
| JP | 2011-176659 A | 9/2011 |
| JP | 5599301 B2 | 10/2014 |
| JP | 5851364 B2 | 2/2016 |

*Primary Examiner* — Dominic E Rego
(74) *Attorney, Agent, or Firm* — Rajeev Madnawat

(57) ABSTRACT

An interference sensor device is disclosed. The interference sensor device includes a first conductive plate and a second conductive plate aligned parallel to the first conductive plate. A non-conductive matter is included between the first conductive plate and the second conductive plate. A band pass filter is coupled with the first conductive plate and the second conductive plate. The band pass filter includes a sensor coil. A current transformer having a primary side and a secondary side is included. The primary side is coupled with the band pass filter, and the secondary side is configured to be coupled with a cable. The current transformer having a high capacitive isolation.

10 Claims, 2 Drawing Sheets

(56) References Cited

U.S. PATENT DOCUMENTS

| | | | |
|---|---|---|---|
| 2005/0134408 A1* | 6/2005 | Hirabayashi | H01L 23/64 333/204 |
| 2012/0086921 A1* | 4/2012 | Horsfall | G03B 21/14 353/85 |
| 2015/0171709 A1* | 6/2015 | Ito | H02K 9/22 310/52 |
| 2018/0233126 A1* | 8/2018 | Zafeiropoulos | G01H 1/00 |
| 2018/0258824 A1* | 9/2018 | Klietz | B60K 1/04 |
| 2019/0037507 A1* | 1/2019 | Shamir | G01R 21/133 |
| 2019/0222017 A1* | 7/2019 | Miller, III | A61G 12/004 |
| 2019/0296650 A1* | 9/2019 | Wang | H02M 3/33569 |

* cited by examiner

VEHICLE RADIO INTERFERENCE SENSOR

BACKGROUND

An interference in the radio reception occurs when unwanted radio frequency signals disrupt the use of an automobile's radio system. A radio reception can be a broadcast radio reception such as AM, FM, DAB, or reception of mobile phone signals, WIFI, Bluetooth, GNSS and V2X. The radio interference may prevent the radio reception altogether, may cause only a temporary loss of signal, or may affect the quality of the sound. The interference in automobile radios may come from variety of sources. The most common sources for interference are electric and electronic systems in an automobile. One probable cause of this type of interference is the automobile's spark plug wires which degrade over time. Another source of interference can be the charging system of the automobile, especially in electric or hybrid electric automobiles. The alternator that produces electricity to charge the automobile batteries can be a source of electromagnetic energy that may interfere with the radio reception in an automobile.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, an interference sensor device is disclosed. The interference sensor device includes a first conductive plate and a second conductive plate aligned parallel to the first conductive plate. A non-conductive matter is included between the first conductive plate and the second conductive plate. A band pass filter is formed with the first conductive plate and the second conductive plate. The band pass filter includes a sensor coil. A current transformer having a primary side and a secondary side is included. The primary side is coupled with the band pass filter, and the secondary side is configured to be coupled with a cable. The current transformer provides a high capacitive isolation. In some examples, the band pass filter includes a resistor that is coupled with the sensor coil in parallel. The band pass filter may also include a tuning capacitor that is coupled with the primary side of the current transformer.

In another embodiment, a vehicle is disclosed. The vehicle includes the interference sensor device installed at the inside bottom of the chassis of the vehicle. In another example, the interference sensor device may be installed at the outside bottom of the chassis of the vehicle. In yet another example, the interference sensor device may be installed at inside top of chassis of the vehicle, above driver seat or at inside top of the chassis of the vehicle under the antenna.

In an example, a broadcast noise filtering system is disclosed. The broadcast noise filtering system includes the interference sensor device, a signal processor configured to receive a first signal from an antenna and a second signal from the interference sensor device and a phase/amplitude changer couple to the signal processor and the interference sensor device configured to be controlled by the signal processor through a feedback loop to correct phase of the second signal. The signal processor is configured to subtract the second signal from the first signal.

The broadcast filtering system may further include an antenna signal amplifier coupled between an antenna port and the signal processor and an interference signal amplifier coupled between the interference sensor device and the phase/amplitude changer.

BRIEF DESCRIPTION OF THE DRAWINGS

So that the way the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

Note that figures are not drawn to scale. Intermediate steps between figure transitions have been omitted so as not to obfuscate the disclosure. Those intermediate steps are known to a person skilled in the art.

DETAILED DESCRIPTION

Many well-known manufacturing steps, components, and connectors have been omitted or not described in detail in the description so as not to obfuscate the present disclosure.

A version of a vehicle interference sensor is described in U.S. Pat. No. 10,381,995 entitled "Vehicle Radio Interference Sensor Device", first published at grant on Aug. 13, 2019, by the same inventors and applicant as the inventors and applicant of the present application.

A vehicle interference sensor having two conductive plates and a filter is described herein. The conductive plates includes a substrate between the plates that together with the plates form a capacitor. The coil is configured to sense or receive magnetic fields in one or more directions. A coupling unit is provided to couple the capacitive plates with the coil. An additional capacitor and a resistor may be employed to tune the interference sensor to the resonance frequency of the broadcast signal.

Figure 1:
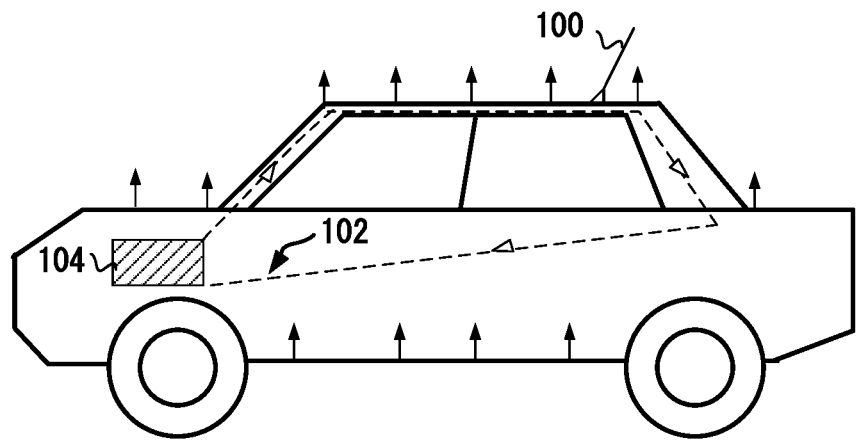
FIG. 1 depicts noise paths caused by automobile engine and electronic components.

FIG. 1 depicts noise paths caused by automobile engine and electronic components. The length of the rod antenna 100 is typically in the range of 10 centimeters to 80 centimeters cm. The rod antenna 100 is mounted on the rooftop of a vehicle. The received radio signals are amplified by a low noise amplifier positioned at the antenna feeding port. The feeding port has two feeding connections, the first connection is at the start of the rod antenna 100 close to the rooftop and the second connection is at the rooftop.

The engine 104 may be powered by batteries. When DC voltage is converted into variable AC voltage to drive the vehicle's drive train, such conversion also generates electromagnetic fields. These electromagnetic fields induce current and voltage in the vehicle's chassis and rooftop. Since the rooftop is part of the antenna 100, the induced interference is coupled to the antenna feeding port. As depicted, the noise current path 102 passes through the rooftop and chassis and may interfere with the radio reception received through the antenna 100.

Figure 2:
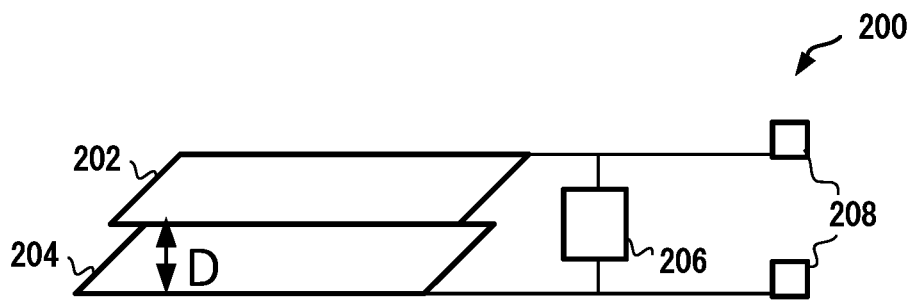
FIG. 2 shows a noise sensor in accordance with one or more embodiments of the present disclosure.

FIG. 2 shows an interference sensor 200. The interference sensor 200 includes a first conductive plate 202 and a second conductive plate 204 separated from each other by the distance D. Between the first conductive plate 202 and the second conductive plate 204, there may be a nonconductive material or air. The interference sensor 200 also includes a sensor coil 206 that is energized by the electromagnetic field captured by the first conductive plate 202 and the second conductive plate 204 as well as the radio interference captured directly by the coil 206. The interference sensor 200 includes two connecting ports 208 to couple the interference sensor 200 with a noise reduction circuit.

Figure 3:
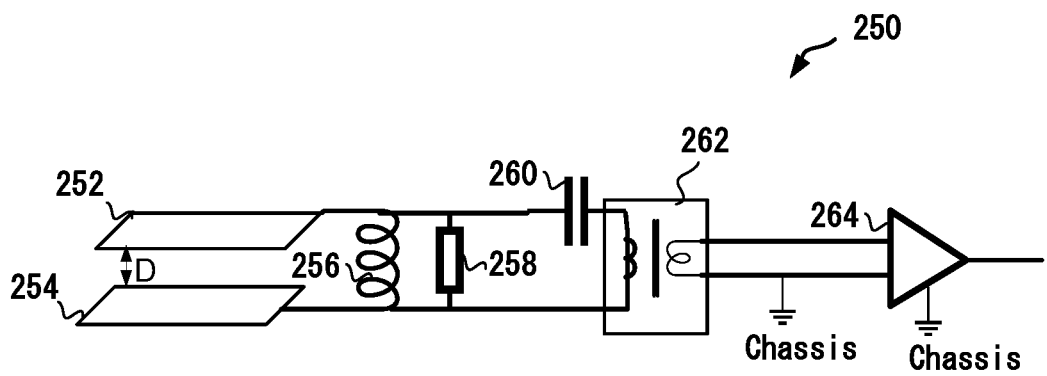
FIG. 3 shows a noise sensor in accordance with one or more embodiments of the present disclosure.

FIG. 3 shows an interference sensor 250 in another embodiment. The interference sensor 250 includes the first conductive plate 252 and the second conductive plate 254 separated from each other by an arbitrary distance D. The first conductive plate 252 and the second conductive plate 254 are coupled to a coil 256 and a resistor 258. The coil 256 and the resistor 258 are coupled together in parallel and the resistor 258 is coupled to a capacitor 260. The values of the inductor or coil 256, the resistor 258 and the capacitor 260 can be set to address a particular range of frequencies for the purpose of selecting the correlated interference in the received radio broadcast band.

The two plates 252, 254 along with the coil 256, the resistor 258 and the capacitor 260 form a resonance circuit to select the correlated unwanted noise that is introduced when the plates 252, 254 are coupled to the chassis of the vehicle shown in FIG. 1. In one test example, the capacitance of the sensor plates 252 254 can be approximately 4.5 pF, the inductance of the sensor coil 256 can be approximately 3.8 uH, the value of the tuning capacitor 260 can be approximately 56 pF and the value of the tuning resistor 258 can be 5000 ohms. The Q factor of the resonance circuit stated above can be approximately 23.5 and the corresponding bandwidth of the resonance circuit can be approximately 450 kHz. These values can be tuned to a particular frequency.

The electric field of the correlated interference induces a voltage between two conductive plates 252, 254. The correlated magnetic interference field is measured by a coil 256. The interference sensor 250 may also include a current transformer 262 and a signal amplifier 264. The vehicle chassis provides the ground for the amplifier circuit 264. In one example, the current transformer 262 is a step up transformer that includes more number of windings on the secondary side compared to the primary side.

The interference sensor is resonated at the desired carrier frequency set with a capacitor 260 and the bandwidth of the resonance circuit is set by a resistor 258. The current transformer 262 has a primary set of windings for measuring the resonance current that circulates in the resonance circuit that includes the coil 256, the resistor 258 and the capacitor 260. The use of the current transformer 262 is advantageous because it provides firstly a high capacitive isolation and secondly a low load impedance that results in a reduction of non-correlated interference signals received by the connection cable.

The plates 252 and 254 with the sensor coil 256 may be tuned to broadcast frequency by varying the capacitor 260. In some examples, the value of the sensor coil can be in the range of 2 uH to 10 uH. The bandwidth of the sensor 250 can be set as using the resistor 258. The primary side of the current transformer 262 measures the resonance current generated by the correlated interference fields. The secondary side of the current transformer 262 is connected to the amplifier 264 through a cable. The non-correlated interference induced in the cable is reduced due to the low impedance seen from the secondary side of the current transformer 262 and due to the high capacitive isolation of the current transformer. In one example, the input impedance of the signal amplifier 264 can be 50 ohms while the impedance seen from the secondary side of the current transformer 262 is only a few ohms or lower and as such almost shorting the non-correlated interference signals. In one example, a 40 db noise reduction has been measured in a prototype of the noise sensor 250.

Figure 4:
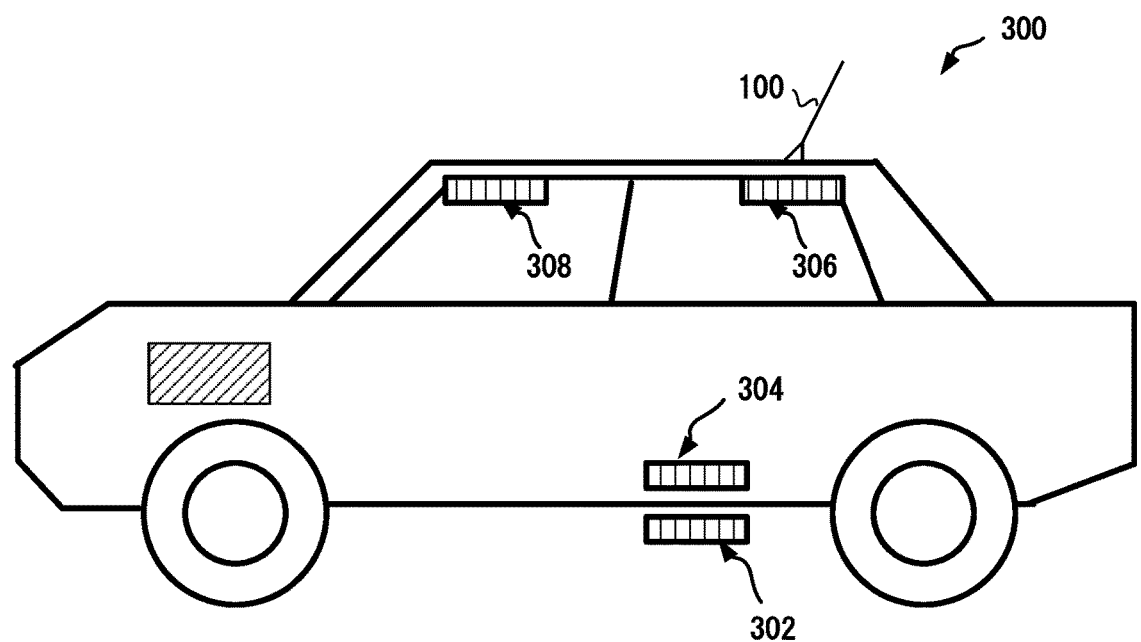
FIG. 4 shows a plurality of noise sensors installed in an automobile in accordance with one or more embodiments of the present disclosure.

The values used in the prototype: Capacitance of the sensor plates==4.5 pF, Inductance of the sensor coil:=3.8 uH, Tuning capacitor 260=56 pF, Resistor 258=5000 ohms, Current transformer 262:
Core: torpid 3 mm diameter 4C6 material
Primary: 1 winding
Secondary 5 windings FIG. 4 shows an example of the placement of the interference sensors 250 in a vehicle 300. The interference sensor 250 is placed where the reception of the broadcast signal is minimal, e.g., inside the vehicle 300 and where the interference is correlated with the interference received by the antenna 100. The chassis of the vehicle 300 creates a faraday cage, hence the broadcast signal inside the vehicle 300 is minimal. As depicted, one or more interference sensors 250 may be placed inside the vehicle 300 above driver's seat. Alternatively, the interference sensor 250 may be placed inside the vehicle 300 towards the rear, under the antenna 100. Under the chassis of the vehicle 300 may also be an advantageous position because the radio signals are attenuated due to the ground which is capacitively coupled to the lower side of the chassis.

Figure 5:
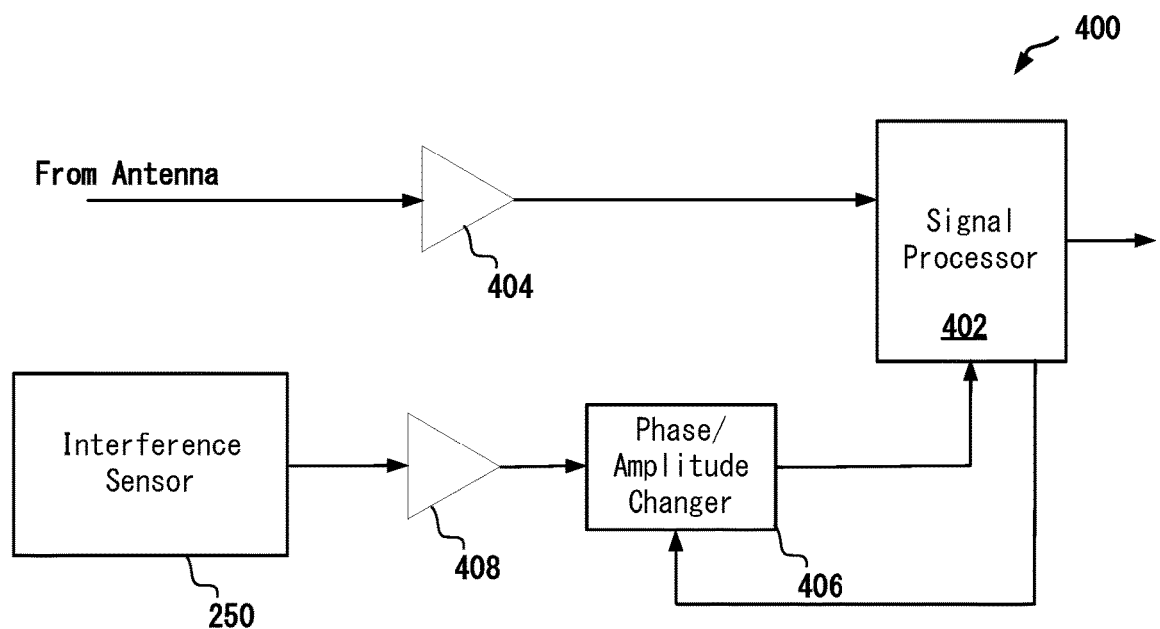
FIG. 5 shows a noise cancellation circuit in accordance with one or more embodiments of the present disclosure.

FIG. 5 shows a noise cancellation circuit 400. The noise cancellation circuit 400 includes an interference sensor 250. As discussed in FIG. 4, the interference sensor 250 may be installed in a vehicle where there is minimal amount of broadcast signal. The interference sensor 250 is installed coupled to the chassis of the vehicle 300. The interference captured by the interference sensor 250 is amplified by a low noise amplifier 408 and the amplified signal is inputted to a phase and amplitude changer 406 which is controlled by a signal processor 402. The phase and amplitude changer 406 is configured to produce a signal that is correlated to the signal from the antenna and similar in amplitude to the signal from the antenna after amplification by the low noise amplifier 406. The signal from the antenna includes the broadcast signal as well as the interference signal. The signal processor 402 subtracts the signal from the interference sensor path from the signal from the antenna path to produce a relatively noise and interference free broadcast signal.

Going back to FIG. 4, the interference sensor 304 is installed close to the chassis of the vehicle 300 and is capacitively coupled to the chassis. Due to the electric field vector orientation, the interference field induces a voltage between the plate 252 and the plate 254. The field to voltage transfer function may be defined as follows:

$$v_1(x) = E(x)DQ \frac{C_s}{\varepsilon r(C_s + C_{amp})}$$

Where:
$V_1$=induced voltage
E=electric interference field
D=distance between the plates
Cs=capacity formed by the two plates
Camp=capacity of the amplifier connected to the sensor
εr=dielectric constant of the substrate between the two plates
Q=quality factor of the sensor including amplifier
x=position on the chassis The conductive plates are measuring the common model signal which is represented by the electric field on the chassis of the vehicle 300. The differential mode signal, which are the circulating currents can be measured by means of their magnetic field. The magnetic field is captured by the sensor coil 256.

The conversion from magnetic interference fields to voltage in one coil can be defined as follows:

$$V_2(x) = Q2\pi N \, Su\mu_0\mu_r H(x) F$$

Where:
N=the number of turns in the coil
F=frequency
Su=surface area of the coil core
H=the magnetic field at the receive coil
$\mu_o = 4 \cdot pi \cdot 10^{-7}$ H/m is magnetic permeability of vacuum
$\mu_r$=relative magnetic permeability of the receive coil rod
x=position at the chassis
Q=quality factor of the sensor resonance circuit Some or all of these embodiments may be combined, some may be omitted altogether, and additional process steps can be added while still achieving the products described herein. Thus, the subject matter described herein can be embodied in many different variations, and all such variations are contemplated to be within the scope of what is claimed.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. An interference sensor device, comprising:
   a first conductive plate;
   a second conductive plate aligned parallel to the first conductive plate;
   a non-conductive matter between the first conductive plate and the second conductive plate;
   a band pass filter formed with the first conductive plate and the second conductive plate, wherein the band pass filter includes a sensor coil;
   a current transformer having a primary side and a secondary side, wherein the primary side is coupled with the low pass filter, and the secondary side is configured to be coupled with a cable, wherein the current transformer having a high capacitive isolation.

2. The interference sensor device of claim 1, wherein the band pass filter includes a resistor that is coupled with the sensor coil in parallel.

3. The interference sensor device of claim 1 wherein the band pass filter includes a tuning capacitor that is coupled with the primary side of the current transformer.

4. A vehicle, comprising the interference sensor device of claim 1 installed at inside bottom of chassis of the vehicle.

5. A vehicle, comprising the interference sensor device of claim 1 installed at outside bottom of chassis of the vehicle.

6. A vehicle, comprising the interference sensor device of claim 1 installed at inside top of chassis of the vehicle, above driver seat.

7. A broadcast noise filtering system, comprising:
   an interference sensor device, including:
     a first conductive plate;
     a second conductive plate aligned parallel to the first conductive plate;
     a non-conductive matter between the first conductive plate and the second conductive plate;
     a low pass filter coupled with the first conductive plate and the second conductive plate, wherein the low pass filter includes a sensor coil;
     a current transformer having a primary side and a secondary side, wherein the primary side is coupled with the low pass filter, and the secondary side is configured to be coupled with a cable, wherein the current transformer is a step up transformer;

a signal processor configured to receive a first signal from an antenna and a second signal from the interference sensor device; and a phase/amplitude changer coupled to the signal processor and the interference sensor device configured to be controlled by the signal processor through a feedback loop to correct phase and amplitude of the second signal;

wherein the signal processor is configured to subtract the second signal from the first signal.

8. The broadcast noise filtering system of claim 7, further including an antenna signal amplifier coupled between an antenna port and the signal processor.

9. The broadcast noise filtering system of claim 7, further including an interference signal amplifier coupled between the interference sensor device and the phase/amplitude changer.

10. The broadcast noise filtering system of claim 7, wherein a value of the sensor coil is 2 uH to 10 uH.

* * * * *